(12) United States Patent
Aoki

(10) Patent No.: US 7,652,506 B2
(45) Date of Patent: Jan. 26, 2010

(54) COMPLEMENTARY SIGNAL GENERATING CIRCUIT

(75) Inventor: Mikio Aoki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/723,660

(22) Filed: Mar. 21, 2007

(65) Prior Publication Data

US 2007/0222479 A1   Sep. 27, 2007

(30) Foreign Application Priority Data

Mar. 22, 2006   (JP) .............................. 2006-078572

(51) Int. Cl.
  *H03K 19/04*   (2006.01)
(52) U.S. Cl. .................... 326/83; 326/112; 326/119; 326/121
(58) Field of Classification Search ................. 326/83, 326/81, 68, 72; 327/333
  See application file for complete search history.

(56) References Cited

U.S. PATENT DOCUMENTS 6,198,328 B1   3/2001   Heyne et al.
6,424,176 B2 *   7/2002   Sato et al. ..................... 326/83
2002/0186060 A1 *   12/2002   Uenishi et al. .............. 327/108

FOREIGN PATENT DOCUMENTS

| CN | 1235413 A | 11/1999 |
| JP | 3-258015 | 11/1991 |
| JP | 2002-368602 | 12/2002 |
| JP | 2003-198343 | 7/2003 |

OTHER PUBLICATIONS

Chinese Office Action dated Aug. 7, 2009 with English-language translation.

* cited by examiner

*Primary Examiner*—Vibol Tan
(74) *Attorney, Agent, or Firm*—McGinn IP Law Group, PLLC (57) ABSTRACT

A complementary signal generating circuit according to an embodiment of the present invention includes: an inverting element inverting a first signal to generate a second signal; a first transistor connecting a first power supply potential and a first output terminal electrically in accordance with the first signal; a second transistor connecting the first output terminal and a second power supply potential electrically in accordance with the second signal; a third transistor connecting the first power supply potential and a second output terminal electrically in accordance with the second signal; and a fourth transistor connecting the second output terminal and the second power supply potential electrically in accordance with the first signal.

17 Claims, 10 Drawing Sheets

|  | DELAY | DIFFERENCE IN DELAY OF RISE-FALL | DIFFERENCE IN DELAY OF TRUE-BAR | DUTY |
|---|---|---|---|---|
| SIGNAL GENERATING CIRCUIT 800 OF RELATED ART | MAX=332ps | MAX-MIN=52ps | MAX=30ps | 47.6~53.0% |
| SIGNAL GENERATING CIRCUIT 200 OF THIS EMBODIMENT | MAX=319ps | MAX-MIN=27ps | MAX=27ps | 49.4~51.3% |

Fig. 8

RELATED ART

Fig. 9

RELATED ART

Fig. 10

RELATED ART
Fig. 11

COMPLEMENTARY SIGNAL GENERATING CIRCUIT

BACKGROUND OF THE INVENTION

1. Field of the Invention

The present invention relates to a complementary signal generating circuit, and more particularly to a complementary signal generating circuit generating an in-phase signal and a reverse phase signal.

2. Description of Related Art

Up to now, there has been known a complementary signal generating circuit for generating a complementary signal composed of an in-phase signal that is a signal in phase with an input signal and a reverse phase signal that is 180° out of phase with an input signal. The complementary signal is used in a LVDS (Low Voltage Differential Signals) circuit or a memory drive circuit. As these circuits have increased their operational speeds in recent years, a demand for a technique of generating a complementary signal with higher precision grows.

Figure 9:
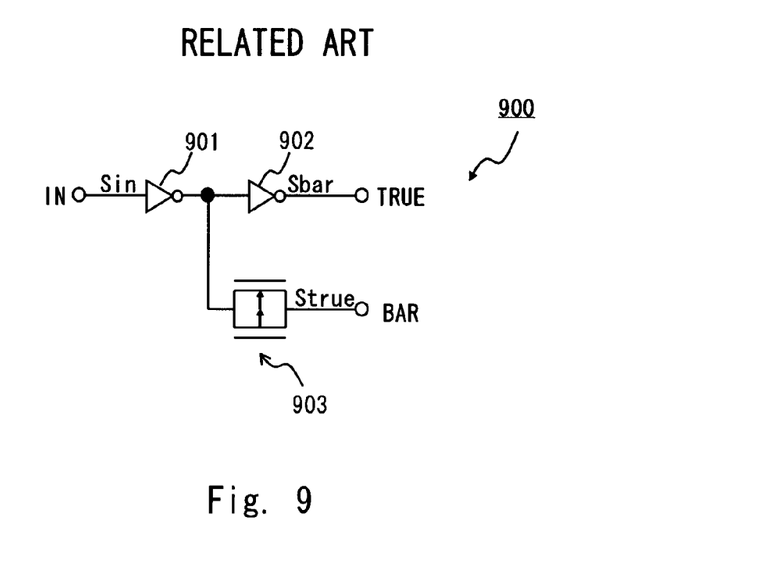
FIG. 9 is a circuit diagram of the configuration of a conventional complementary signal generating circuit.

FIG. 9 is a circuit diagram of the configuration of a conventional complementary signal generating circuit 900. As shown in FIG. 9, in the conventional complementary signal generating circuit 900, inverters 901 and 902 are connected in series. Further, a transfer gate 903 is connected with an intermediate node between the inverters 901 and 902. When an input signal Sin is input to the inverter 901 from an the input terminal IN, the inverter 902 sends an in-phase signal Strue to a terminal TRUE, and a reverse phase signal Sbar is sent to a terminal BAR from the transfer gate 903.

In the conventional complementary signal generating circuit 900, the transfer gate 903 gives a delay to the reverse phase signal Sbar in order to reduce a difference in delay between the in-phase signal Strue and the reverse phase signal Sbar. Thus, in the conventional complementary signal generating circuit 900, the circuit configuration differs between an output stage for the in-phase signal Strue and an output stage for the reverse phase signal Sbar.

Figure 10:
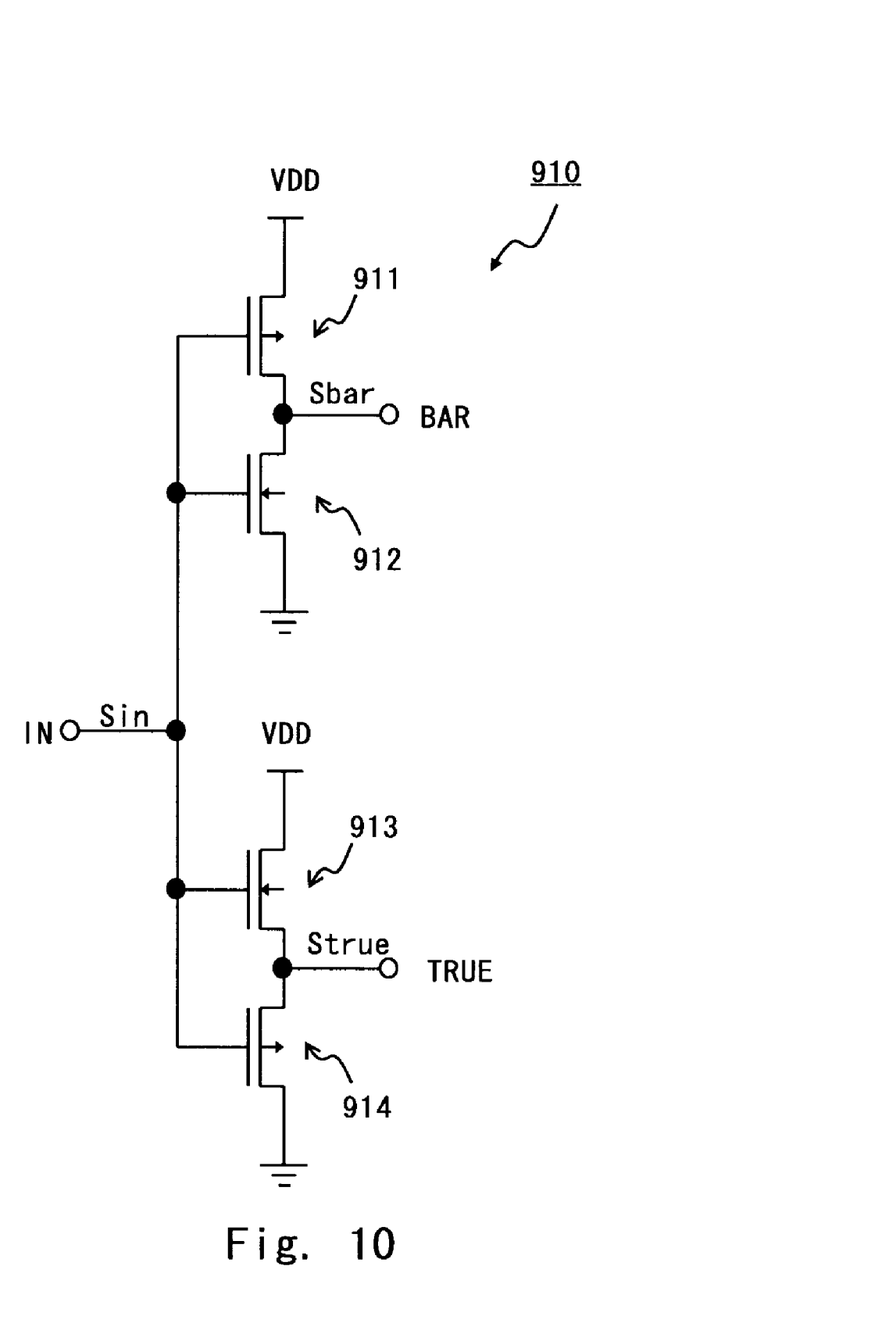
FIG. 10 is a circuit diagram of the configuration of a conventional complementary signal generating circuit.

FIG. 10 is a circuit diagram of the configuration of a conventional complementary signal generating circuit 910 disclosed in Japanese Unexamined Patent Publication No. 3-258015. As shown in FIG. 10, in the conventional complementary signal generating circuit 910, a P-channel MOS transistor 911 and an N-channel MOS transistor 912 are connected in series. Further, an N-channel MOS transistor 913 and a P-channel MOS transistor 914 are connected in series. When an input signal Sin is input to each gate of the MOS transistors 911 to 914 from an the input terminal IN, a reverse phase signal Sbar is output to a terminal BAR from an intermediate node between a P-channel MOS transistor 911 and an N-channel MOS transistor 912. Further, an in-phase signal Strue is output to a terminal TRUE from an intermediate node between an N-channel MOS transistor 913 and a P-channel MOS transistor 914.

In the conventional complementary signal generating circuit 910, an output stage for the reverse phase signal Sbar is set to an inverter configuration, and an output stage for the in-phase signal Strue is set to a source follower configuration. In this way, a difference in delay between the in-phase signal Strue and the reverse phase signal Sbar is minimized. Thus, in the conventional complementary signal generating circuit 910, the circuit configuration differs between the output stage for the in-phase signal Strue and the output stage for the reverse phase signal Sbar.

Figure 11:
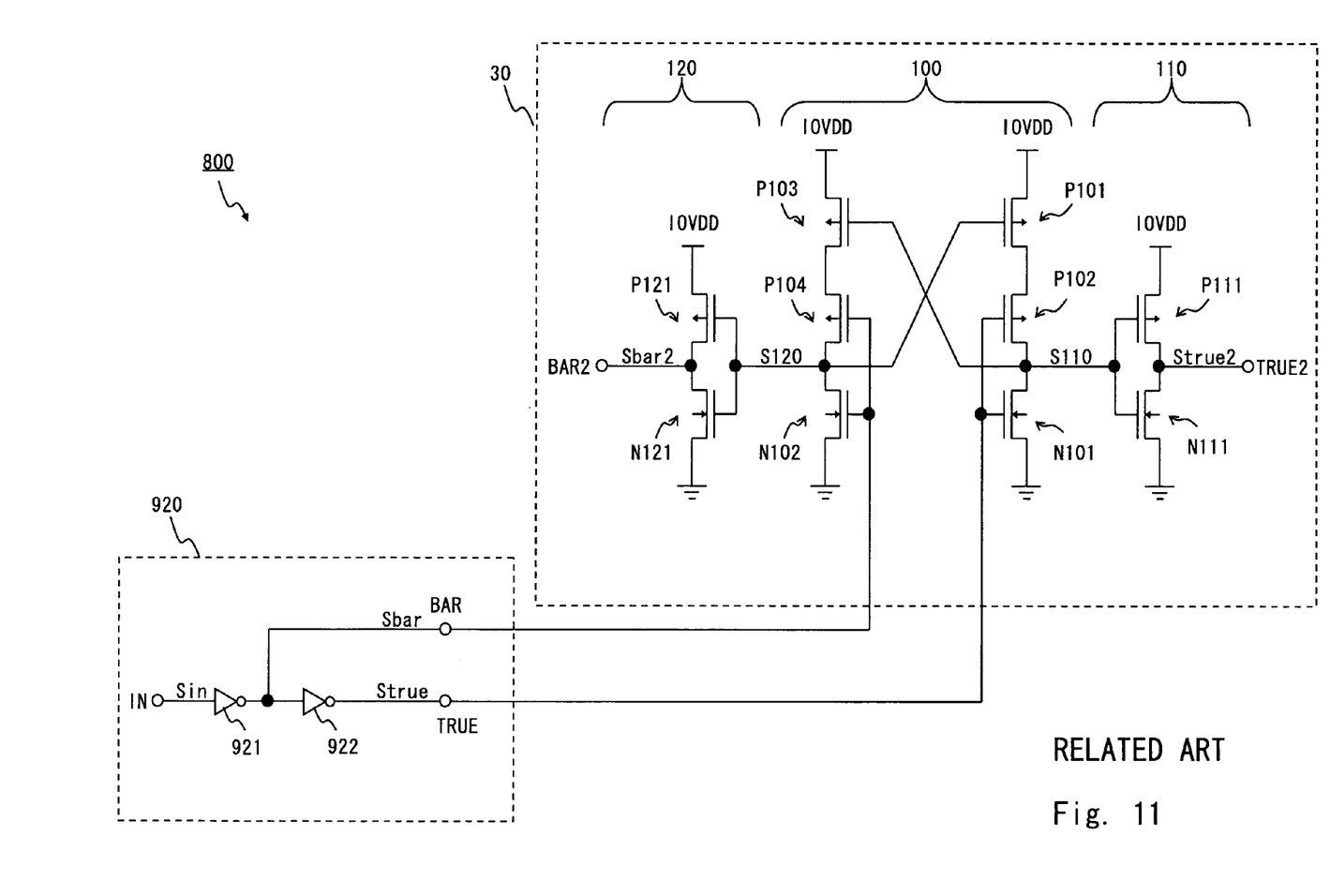
FIG. 11 is a circuit diagram of the configuration of a conventional complementary signal generating circuit.

FIG. 11 is a circuit diagram of the configuration of a conventional signal generating circuit as disclosed in Japanese Unexamined Patent Publication No. 2002-368602. This conventional signal generating circuit 800 generates a desired complementary signal by means of a conventional complementary signal generating circuit 920 and a level shifting circuit 30.

In the conventional complementary signal generating circuit 920, inverters 921 and 922 are connected in series. If an input signal Sin is input from the input terminal IN to the inverter 921, a reverse phase signal Sbar is output from the inverter 921 to a terminal BAR, and an in-phase signal Strue is output from the inverter 922 to a terminal TRUE.

The level shifting circuit 30 includes a flip-flop 100, and output circuits 110 and 120. In the flip-flop 100, P-channel MOS transistors P101 and P102 and an N-channel MOS transistor N101 are connected in series. Further, P-channel MOS transistors P103 and P104 and an N-channel MOS transistor N102 are connected in series. A gate of the P-channel MOS transistor P101 is connected with an intermediate node between the P-channel MOS transistor P104 and the N-channel MOS transistor N102. A gate of the P-channel MOS transistor P103 is connected with an intermediate node between the P-channel MOS transistor P102 and the N-channel MOS transistor N101.

In the output circuit 110, a P-channel MOS transistor P111 and an N-channel MOS transistor N111 are connected in series. In the output circuit 120, a P-channel MOS transistor P121 and an N-channel MOS transistor N121 are connected in series.

An in-phase signal Strue from the conventional complementary signal generating circuit 920 is input to each gate of the P-channel MOS transistor P102 and the N-channel MOS transistor N101. In addition, a reverse phase signal Sbar is input to each gate of the P-channel MOS transistor P104 and the N-channel MOS transistor N102.

If an in-phase signal Strue from the conventional complementary signal generating circuit 920 is at High level, a gate potential of the N-channel MOS transistor N101 increases, and a reverse phase signal S110 is shifted to Low level. Then, a gate potential of the P-channel MOS transistor P103 lowers, and an in-phase signal S120 is shifted to High level.

If a reverse phase signal Sbar from the conventional complementary signal generating circuit 920 is at High level, a gate potential of the N-channel MOS transistor N102 increases, and the in-phase signal S120 is shifted to Low level. Then, a gate potential of the P-channel MOS transistor P101 lowers, and a reverse phase signal S110 is shifted to High level.

The output circuit 110 inverts the reverse phase signal S110 to output an in-phase signal Strue2. The output circuit 120 inverts the in-phase signal S120 to output a reverse phase signal Sbar2.

In the conventional complementary signal generating circuit 920, a delay is given to the in-phase signal Strue by the inverter 922. The level shifting circuit 30 is provided this way in order to minimize a difference in delay between the in-phase signal Strue and the reverse phase signal Sbar.

In addition, a circuit disclosed in Japanese Unexamined Patent Publication No. 2003-198343 has been known as another conventional complementary signal generating circuit. In the circuit disclosed in Japanese Unexamined Patent Publication No. 2003-198343, an output signal is fed back to adjust a timing of a complementary signal with an inverting circuit such as an operational amplifier.

As described above, in the conventional complementary signal generating circuit 900 or 910 of FIGS. 9 and 10, the circuit configuration differs between the output stage for the in-phase signal and the output stage for the reverse phase signal, resulting in a problem that a through rate difference or difference in delay between the in-phase signal and the reverse phase signal is large, and an influence of production tolerance is also large.

SUMMARY OF THE INVENTION

A complementary signal generating circuit according to an aspect of the present invention includes: an inverting element inverting a first signal to generate a second signal; a first transistor connecting a first power supply potential and a first output terminal electrically in accordance with the first signal; a second transistor connecting the first output terminal and a second power supply potential electrically in accordance with the second signal; a third transistor connecting the first power supply potential and a second output terminal electrically in accordance with the second signal; and a fourth transistor connecting the second output terminal and the second power supply potential electrically in accordance with the first signal.

According to the complementary signal generating circuit, an output stage for an in-phase signal and an output stage for a reverse phase signal have the same circuit configuration in order to minimize a difference in delay or in through rate between the in-phase signal and the reverse phase signal and to suppress an influence of production tolerance.

A complementary signal generating circuit according to another aspect of the present invention includes: a first transistor where a first terminal is connected with a first power supply potential, a second terminal is connected with a first output terminal, and a signal input to an inverting element is supplied to a control terminal; a second transistor where a first terminal is connected with the first output terminal, a second terminal is connected with the second power supply potential, and an inverted signal output from the inverting element is input to a control terminal; a third transistor where a first terminal is connected with the first power supply potential, a second output terminal is connected with a second terminal, and an inverted signal output from the inverting element is input to a control terminal; and a fourth transistor where a first terminal is connected with the second output terminal, a second terminal is connected with the second power supply potential, and a signal input to the inverting element is supplied to a control terminal.

According to the present invention, it is possible to provide a complementary signal generating circuit capable of reducing a difference in delay or in through rate between an in-phase signal and a reverse phase signal and suppressing an influence of production tolerance.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

First, a complementary signal generating circuit according to a first embodiment of the present invention is described. In the complementary signal generating circuit of this embodiment, an in-phase signal output stage including two transistors has a same circuit configuration with a reverse phase signal output stage including two transistors.

Figure 1:
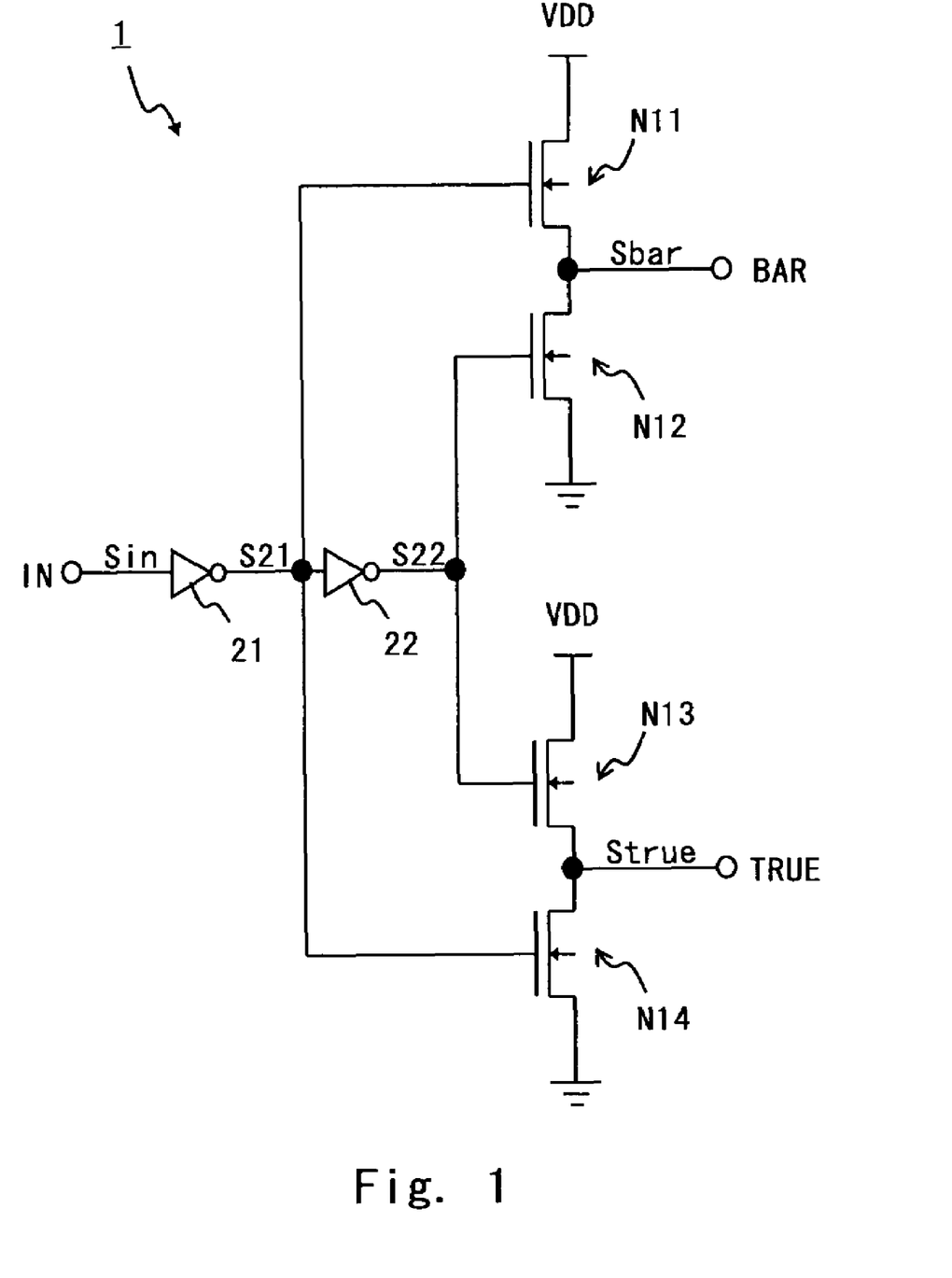
FIG. 1 is a circuit diagram of the configuration of a complementary signal generating circuit according to a first embodiment of the present invention.

Referring to a circuit diagram of FIG. 1, the configuration of the complementary signal generating circuit of this embodiment is described. In a complementary signal generating circuit 1, if an input signal Sin such as a clock signal is input to an input terminal IN, an in-phase signal Strue that is in phase with the input signal is output from a terminal TRUE, and a reverse phase signal Sbar that is opposite in phase to the input signal is output from a terminal BAR.

As shown in FIG. 1, the complementary signal generating circuit 1 includes N-channel MOS transistors N11, N12, N13, and N14 and inverters 21 and 22. The inverters 21 and 22 are connected in series. When an input signal Sin is input from the input terminal IN, the inverter 21 inverts the input signal to generate a reverse phase signal S21 (first signal). Then, the inverter 21 supplies the generated reverse phase signal S21 to the inverter 22 and gates of the N-channel MOS transistors N11 and N14. Then, the inverter 22 (inverting element) inverts the reverse phase signal S21 to generate an in-phase signal S22 (second signal). After that, the inverter 22 supplies the generated in-phase signal S22 to the gates of the N-channel MOS transistors N12 and N13.

The N-channel MOS transistor N11 (first transistor) and the N-channel MOS transistor N12 (second transistor) constitute a reverse phase signal output unit. The reverse phase signal output unit outputs a reverse phase signal Sbar from the terminal BAR (first output terminal) based on the reverse phase signal S21 and the in-phase signal S22.

The N-channel MOS transistors N11 and N12 are connected in series between a power supply potential VDD (first power supply potential) and a ground potential GND (second power supply potential). That is, the N-channel MOS transistor N11 has a drain (first terminal) connected with the power supply potential VDD and a source (second terminal) connected with the terminal BAR and a drain of the N-channel MOS transistor N12. The N-channel MOS transistor N12 has a source connected with the ground potential GND.

The N-channel MOS transistor N11 executes ON/OFF-control over a current path between the power supply potential, VDD and the terminal BAR in accordance with the reverse phase signal S21 input to the gate (control terminal). The N-channel MOS transistor N12 executes ON/OFF-control over a current path between the terminal BAR and the ground potential GND in accordance with the in-phase signal S22 input to the gate (control terminal).

The N-channel MOS transistor N13 (third transistor) and the N-channel MOS transistor N14 (fourth transistor) constitute an in-phase signal output unit. The in-phase signal output unit outputs an in-phase signal Strue from the terminal TRUE (second output terminal) based on the reverse phase signal S21 and the in-phase signal S22.

Similar to the N-channel MOS transistors N11 and N12, the N-channel MOS transistors N13 and N14 are connected in series between the power supply potential VDD and the ground potential GND. That is, the N-channel MOS transistor N13 has a drain connected with the power supply potential VDD and a source connected with the terminal TRUE and a drain of the N-channel MOS transistor N14. The N-channel MOS transistor N14 has a source connected with the ground potential GND.

The N-channel MOS transistor N13 executes ON/OFF-control over a current path between the power supply potential VDD and the terminal BAR in accordance with the in-phase signal S22. The N-channel MOS transistor N14 executes ON/OFF-control over a current path between the terminal TRUE and the ground potential GND based on the reverse phase signal S21.

The transistor pair of N-channel MOS transistors N11 and N12 and the transistor pair of N-channel MOS transistors N13 and N14 which constitutes the output stages of the complementary signal generating circuit 1 have the same circuit configuration. In particular, the N-channel MOS transistors N11 and N13 have the same characteristics; for example these transistors are manufactured with the same size and manufacturing process. The same holds true for the N-channel MOS transistors N12 and N14. In this embodiment, the N-channel MOS transistors N11 and N13 are depletion type MOS transistors. Since a threshold value of the depletion type transistor is low, the reverse phase signals Sbar and the in-phase signal Strue can be increased to a higher voltage level when the transistor is turned ON. The N-channel MOS transistors N12 and N14 are enhancement type MOS transistors.

Referring to timing charts of FIGS. 2A to 2G and FIG. 3, operations of the complementary signal generating circuit of this embodiment are described next. FIGS. 2A to 2G schematically show timings of each signal of complementary signal generating circuit 1.

Figure 2A:
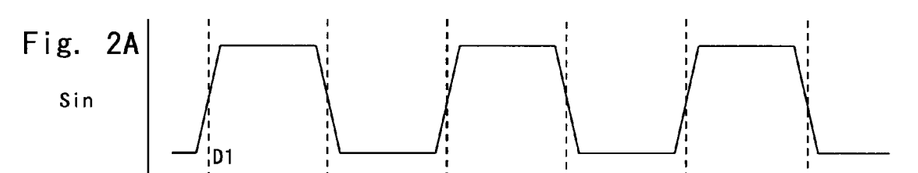
FIGS. 2A to 2G are timing charts of operations of the complementary signal generating circuit of the first embodiment.
Figure 2B:
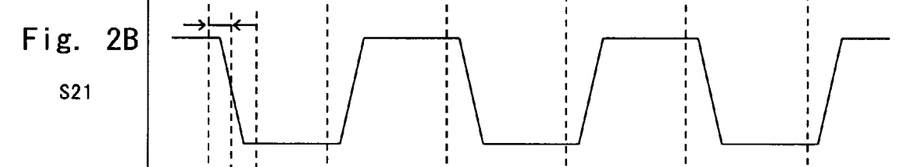
Figure 2C:
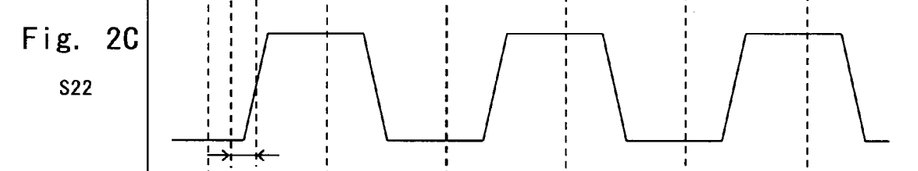

As shown in FIG. 2A, if an input signal Sin is input, as shown in FIG. 2B, a reverse phase signal S21 is generated by the inverter 21, and as shown in FIG. 2C, an in-phase signal S22 is generated by the inverter 22. That is, reverse phase signal S21 becomes a signal delayed from the input signal Sin with a delay D1 by the inverter 21. In-phase signal S22 becomes a signal delayed from the reverse phase signal S21 with a delay D2 by the inverter 22.

Figure 2D:
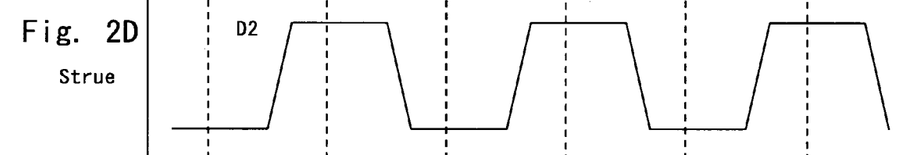
Figure 2E:
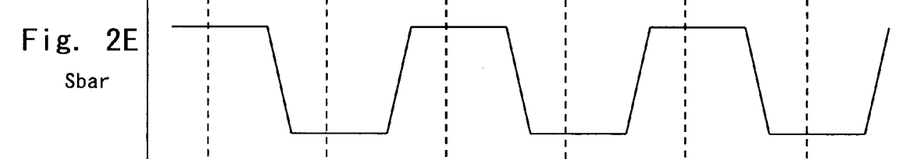
Figure 2F:
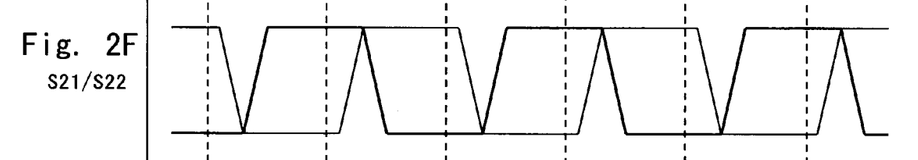

Therefore, as shown in FIG. 2F, if waveforms of the reverse phase signal S21 and that of the in-phase signal S22 are superposed, the two signals do not coincide with each other in rising edge and falling edge, and cross-points (intersections) of the signals appear around High level/Low level.

Then, if the reverse phase signal S21 and the in-phase signal S22 are supplied to the N-channel MOS transistors N13 and N14, the in-phase signal Strue as shown in FIG. 2D is generated. That is, if the reverse phase signal S21 is lowered to Low level, the N-channel MOS transistor N14 is turned OFF. Further, if the in-phase signal S22 is increased to High level, the N-channel MOS transistor N13 is turned ON. Then, the in-phase signal Strue starts increasing up to High level. In contrast, if the reverse phase signal S21 is increased to High level, the N-channel MOS transistor N14 is turned ON. Then, the in-phase signal Strue starts lowering its voltage level. When the in-phase signal S22 lowers to Low level, the N-channel MOS transistor N13 is turned OFF. Then, the in-phase signal Strue is decreased down to Low level.

Likewise, if the reverse phase signal S21 and the in-phase signal S22 are supplied to the N-channel MOS transistors N11 and N12, the reverse phase signal Sbar as shown in FIG. 2E is generated. That is, if the reverse phase signal S21 is lowered to Low level, the N-channel MOS transistor N11 is turned OFF. Further, the in-phase signal S22 is increased to High level, N-channel MOS transistor N12 is turned ON. Then, the reverse phase signal Sbar starts lowering its voltage level down to Low level. In contrast, the reverse phase signal S21 is increased to High level, N-channel MOS transistor N11 is turned ON. Then, the in-phase signal Sbar starts increasing its voltage level. When the in-phase signal S22 is lowered to Low level, the N-channel MOS transistor N12 is turned OFF. Then, the reverse phase signal Sbar is increased to High level.

Figure 2G:
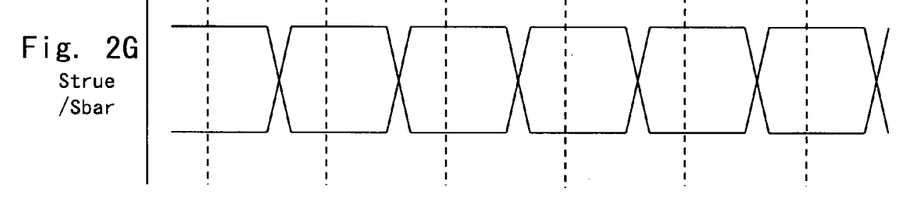

Therefore, as shown in FIG. 2G, if the in-phase signal Strue and the reverse phase signal Sbar are superposed, the two signals coincide with each other in rising and falling edges, and a cross-point of the signals is positioned between High level and Low level.

Figure 3:
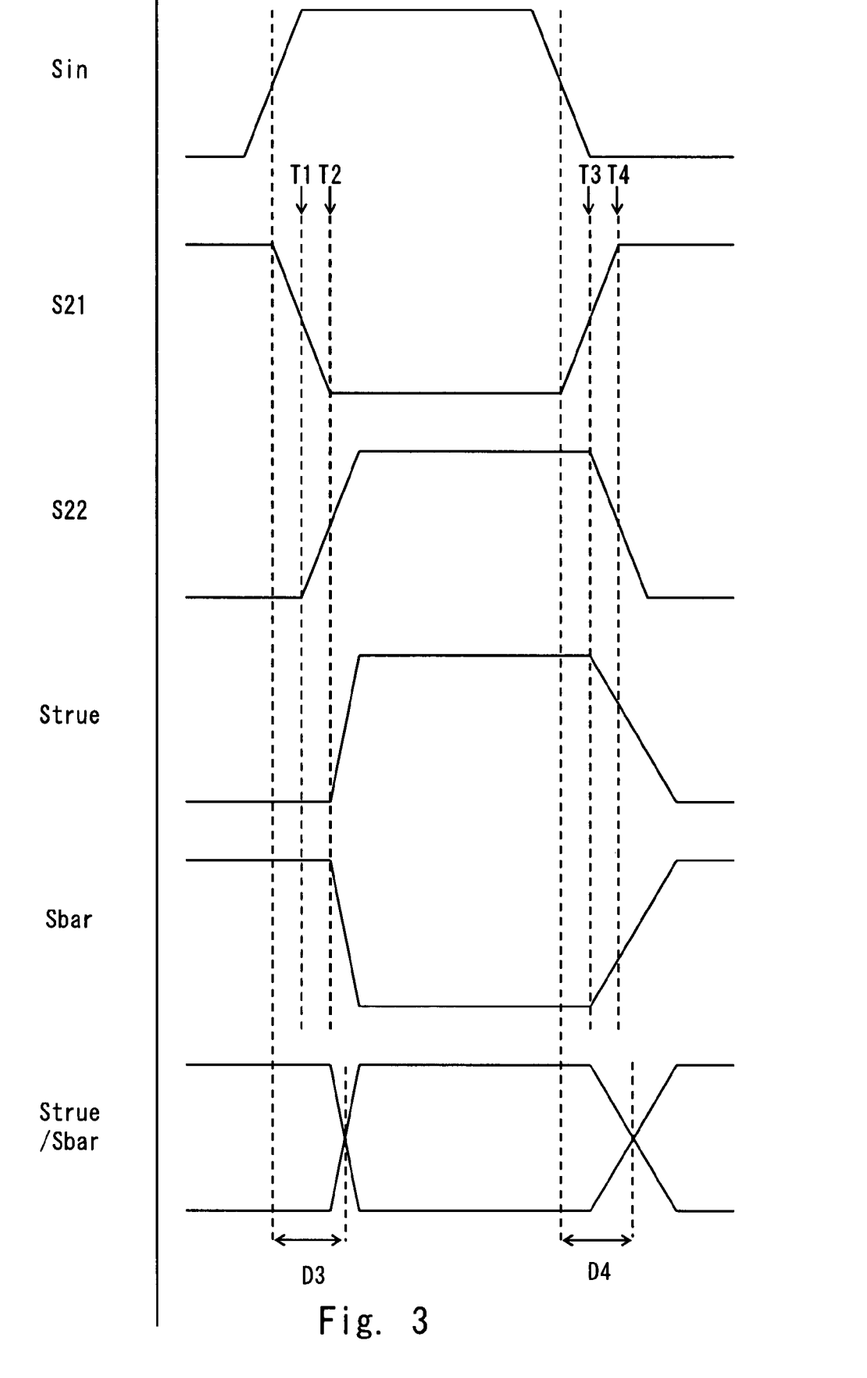
FIG. 3 is a timing chart of operations of the complementary signal generating circuit of the first embodiment.

FIG. 3 is a detailed timing chart of each signal of the complementary signal generating circuit 1. As described above, the reverse phase signal S21 is generated from the input signal Sin with a delay, and the in-phase signal S22 is generated from the input signal Sin with a larger delay.

Here, consideration about a rising edge (rise) of the in-phase signal Strue is made. First, at time T1, the reverse phase signal S21 is lowered and becomes a value less than a threshold value of the N-channel MOS transistor N14. Then, the N-channel MOS transistor N14 is turned OFF. At this time, since the in-phase signal S22 is at Low level, the N-channel MOS transistor N13 is in an OFF state and the in-phase signal Strue is kept at Low level.

Next, at time T2, the in-phase signal S22 is increased and becomes a value over a threshold value of the N-channel MOS transistor N13. Then, the N-channel MOS transistor N13 is turned ON. At this time, the reverse phase signal S21 is at Low level. Accordingly, the N-channel MOS transistor N14 is kept in an OFF state. Then, a current begins to flow from the power supply potential VDD to the terminal TRUE, and a level of the in-phase signal Strue is raised.

That is, after the N-channel MOS transistor N14 is turned OFF and the N-channel MOS transistor N13 is turned ON, the in-phase signal Strue starts increasing up to High level. Therefore, when the in-phase signal Strue rises, there is not a timing both of the N-channel MOS transistors N13 and N14 being not turned ON. Thus, the level of the in-phase signal Strue rises more sharply.

Considering the falling edge (fall) of the in-phase signal Strue, at timing T3, the reverse phase signal S21 starts increasing and is increased above a threshold value of the N-channel MOS transistor N14. Then, N-channel MOS transistor N14 is turned ON. At this time, the in-phase signal S22 is at High level. Accordingly, the N-channel MOS transistor N13 is in an ON state. Then, a current begins to flow from the power supply potential VDD and the terminal TRUE to the ground potential GND, and the in-phase signal Strue starts lowering.

Next, at time T4, the in-phase signal S22 starts lowering and is lowered below a threshold value of the N-channel MOS transistor N13. Then, the N-channel MOS transistor N13 is turned OFF. At this time, the reverse phase signal S21 is at High level. Accordingly, the N-channel MOS transistor N14 is kept ON. Then, a current continuously flows from the terminal TRUE to the ground potential GND, and the in-phase signal Strue is lowered down to Low level.

That is, after the N-channel MOS transistor N14 is turned ON, and the in-phase signal Strue starts lowering, the N-channel MOS transistor N13 is turned OFF, and the in-phase signal Strue is lowered down to Low level. Therefore, when the in-phase signal Strue lowers, there is a timing both of the N-channel MOS transistors N13 and N14 being turned ON, so the in-phase signal Strue falls more gently.

The same holds true for the reverse phase signal Sbar. That is, at time T1, the N-channel MOS transistor N11 is turned OFF in response to the reverse phase signal S21, and at time T2, the N-channel MOS transistor N12 is turned ON in response to the in-phase signal S22, and then the reverse phase signal Sbar starts lowering down to Low level. Therefore, when the reverse phase signal Sbar lowers, there is not a timing both of the N-channel MOS transistors N11 and N12 being not turned ON, so the level of the reverse phase signal Sbar rises more sharply.

Further, at time T3, the N-channel MOS transistor N11 is turned ON in response to the reverse phase signal S21 and the reverse phase signal Sbar starts increasing, and then at time T4, the N-channel MOS transistor N12 is turned OFF in response to the in-phase signal S22 and the reverse phase signal Sbar is increased up to High level. Therefore, when the reverse phase signal Sbar rises, there is a timing both of the N-channel MOS transistors N11 and N12 being turned ON, so the level of the reverse phase signal Sbar rises more gently.

Therefore, the timing and the through rate of the in-phase signal Strue and the reverse phase signal Sbar in rising and falling are made coincide with each other. Further, a delay D3 of the rising waveform against an input signal and a delay D4 of the falling waveform against the input signal match with each other.

As described above, in this embodiment, two inverters and four transistors generate a complementary signal. For example, in the conventional circuit disclosed in Japanese Unexamined Patent Publication No. 2003-198343, the circuit configuration is complicated, and the operational amplifier is used, so a stationary current is generated. In contrast, in this embodiment, a complementary signal can be generated with a simple circuit configuration, and a stationary current is never generated.

Further, an output stage for the in-phase signal Strue and an output stage for the reverse phase signal Sbar have the same circuit configuration, so a difference in delay and in through rate between the in-phase signal Strue and the reverse phase signal Sbar can be minimized, and in addition, an influence of production tolerance can be suppressed. With the same circuit configuration, the rising edge of the in-phase signal Strue and the falling edge of the reverse phase signal Sbar appear at the same timing, and the falling edge of the in-phase signal Strue and the rising edge of the reverse phase signal Sbar appear at the same timing, since the output stages are made active at the same timing. And then the cross point of the in-phase signal Strue and the reverse phase signal Sbar is set constant.

Further, the output stage (N12 and N13) driven in response to the in-phase signal S22 gives a delay to the complementary signal. However, the output stage driven in response to the in-phase signal S22 is not influenced by the output stage driven in response to the reverse phase signal S21. Thus, the delay of the rising waveform against the input signal and the delay of the falling waveform against the input signal are set substantially same, and the duty ratio is compensated for as of the input signal.

Second Embodiment

Next, a correction signal generating circuit according to a second embodiment of the present invention is described. In this embodiment, other devices are used in place of the N-channel MOS transistors of the first embodiment.

Figure 4:
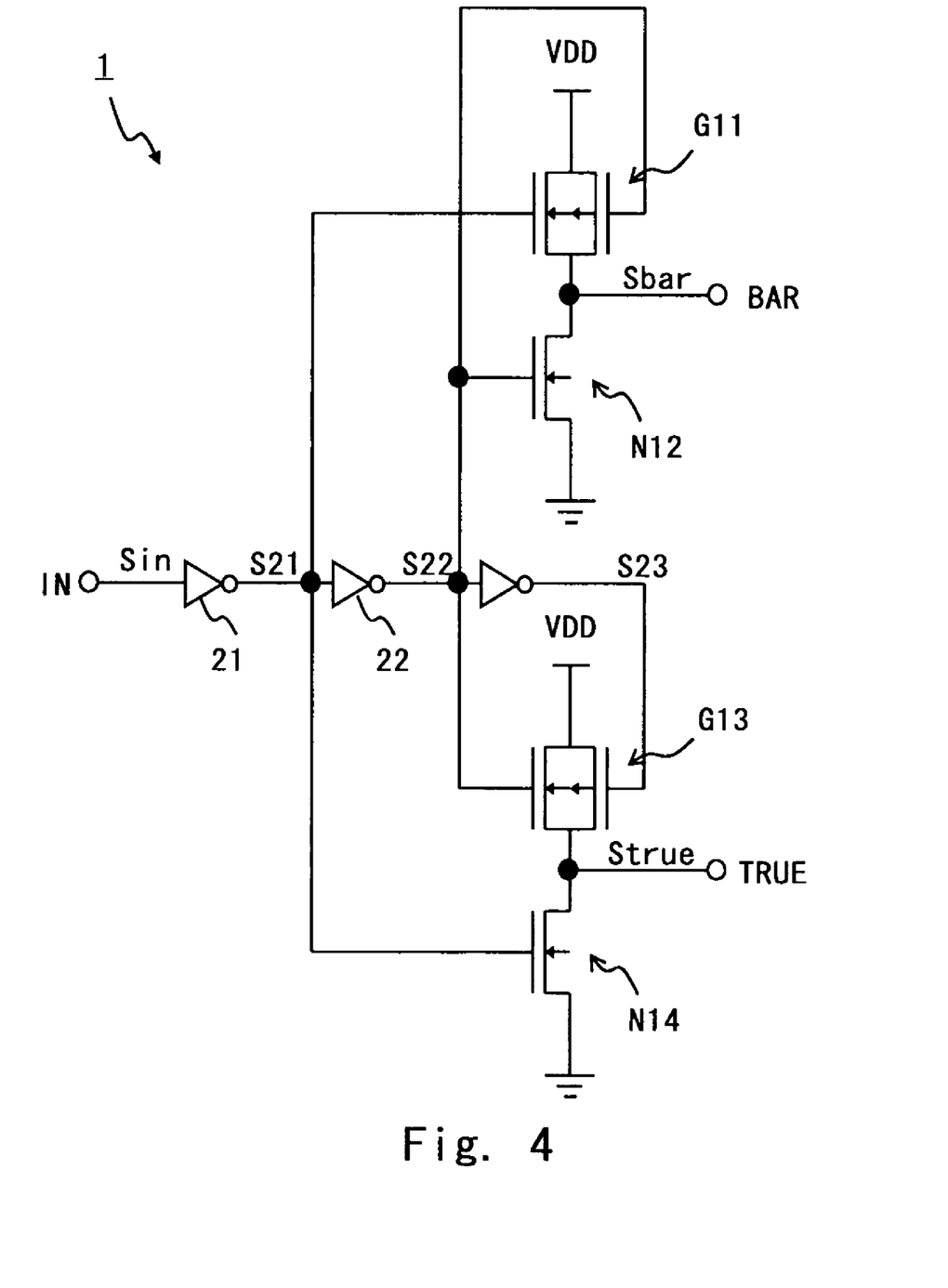
FIG. 4 is a circuit diagram of the configuration of a complementary signal generating circuit according to a second embodiment of the present invention.

FIG. 4 is a circuit diagram of the configuration of the complementary signal generating circuit of this embodiment. The N-channel MOS transistors N11 and N13 of FIG. 1 are replaced with transfer gates G11 and G13. Further, an inverter 23 is added. In FIG. 4, the same components as those of FIG. 1 are denoted by identical reference numerals.

The inverter 23 is connected with the inverters 21 and 22 in series. The inverter 23 inverts the in-phase signal S22 from the inverter 22 to generate a reverse phase signal S23 (third signal).

The transfer gate G11 (first transfer gate) is composed of an N-channel MOS transistor (first transistor) and a P-channel MOS transistor (fifth transistor) which are connected in parallel. The transfer gate G13 (second transfer gate) is composed of an N-channel MOS transistor (third transistor) and a P-channel MOS transistor (sixth transistor) which are connected in parallel. Any one of the transistors is turned ON, and each of the transfer gates G11 and G13 becomes ON state.

Similar to the N-channel MOS transistors N11, in the transfer gate G11, the N-channel MOS transistor is turned ON/OFF in accordance with the reverse phase signal S21. Further, the P-channel MOS transistor is turned ON/OFF in accordance with the in-phase signal S22. The transfer gate G11 is connected between the power supply potential VDD and the N-channel MOS transistors N12. Further, the reverse phase signal S21 is supplied to the gate of the N-channel MOS transistor side from the inverter 21, and the in-phase signal S22 is supplied to the gate of the P-channel MOS transistor side from the inverter 22.

In the transfer gate G13, similar to the N-channel MOS transistor N13, the N-channel MOS transistor is turned ON/OFF in accordance with the in-phase signal S22. Further, the P-channel MOS transistor is turned ON/OFF in accordance with the reverse phase signal S23. The transfer gate G13 is connected between the power supply potential VDD and the N-channel MOS transistor N14. Further, the in-phase signal S22 is supplied to the gate of N-channel MOS transistor side from the inverter 22, and the reverse phase signal S23 is supplied to the gate of the P-channel MOS transistor side from the inverter 23.

The transfer gates G11 and G13 operate as same as the depletion type MOS transistor and increase the reverse phase signals Sbar and the in-phase signal Strue to higher level when it turned ON.

Operations of the complementary signal generating circuit of this embodiment are the same as those of FIGS. 2A to 2G and FIG. 3. That is, as in the in-phase signal Strue, the reverse phase signal S23 having a delay against the in-phase signal S22 is used to further drive the transfer gate G13.

On the rising waveform of the in-phase signal Strue, the reverse phase signal S21 is lowered and the in-phase signal S22 is increased. Then, the N-channel MOS transistor of the transfer gate G13 is turned ON, and the in-phase signal Strue starts increasing. Then, if the reverse phase signal S23 is lowered, the P-channel MOS transistor of the transfer gate G13 is turned ON, and then the in-phase signal Strue is increased to higher level.

On the falling waveform of the in-phase signal Strue, the reverse phase signal S21 is increased, the in-phase signal Strue starts lowering, and the in-phase signal S22 is lowered. Then, the N-channel MOS transistor of the transfer gate G13 is turned OFF, and the in-phase signal Strue is continuously lowered. Then, if the reverse phase signal S23 is increased, the P-channel MOS transistor of the transfer gate G13 is turned OFF, and the in-phase signal Strue is lowered down to Low level.

Further, the same holds true for the reverse phase signal Sbar. The level of the reverse phase signal Sbar falls as follows. The N-channel MOS transistor of the transfer gate G11 is turned OFF by the reverse phase signal S21. Then, the N-channel MOS transistor N12 is turned ON in response to the in-phase signal S22, and P-channel MOS transistor of the transfer gate G11 is turned ON. Then, the reverse phase signal Sbar starts lowering down to Low level.

The level of the reverse phase signal Sbar rises as follows. That is, the N-channel MOS transistor of the transfer gate G11 is turned ON in response to the reverse phase signal S21. Then, the reverse phase signal Sbar starts increasing, after that the N-channel MOS transistor N12 is turned OFF, and the P-channel MOS transistor of the transfer gate G11 is turned ON in response to the in-phase signal S22. Then, the reverse phase signal Sbar is increased to higher level.

Figure 5:
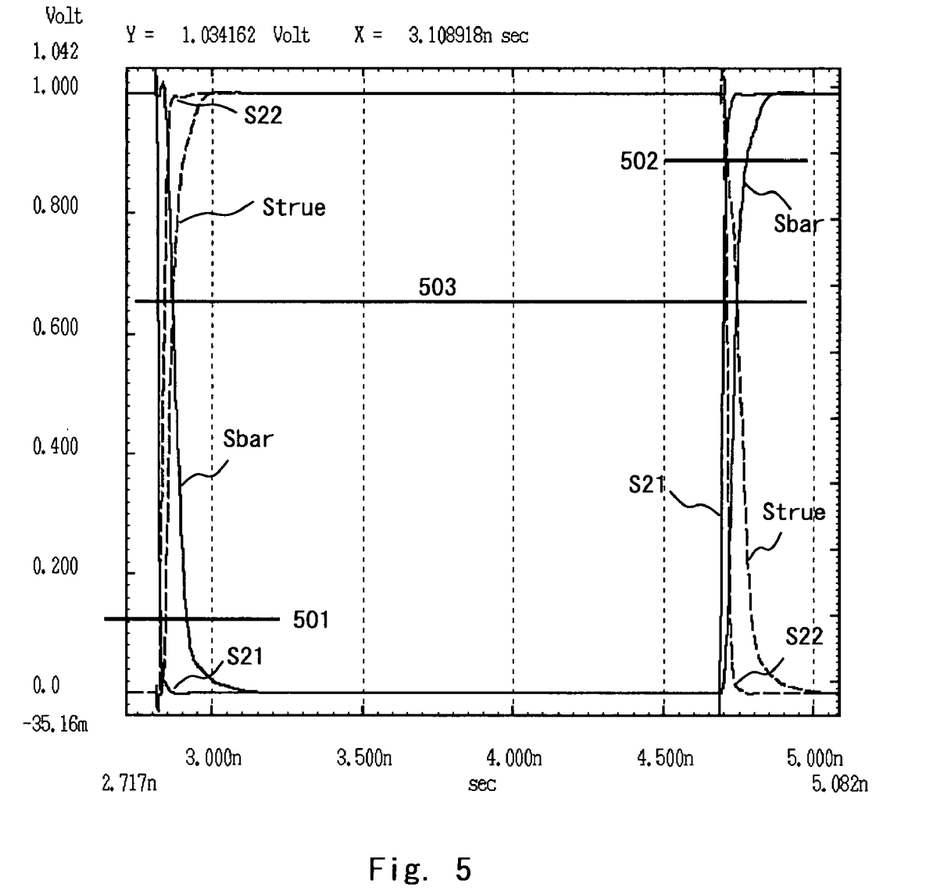
FIG. 5 is a waveform diagram of a simulation result of the complementary signal generating circuit of the second embodiment.
Figure 6:
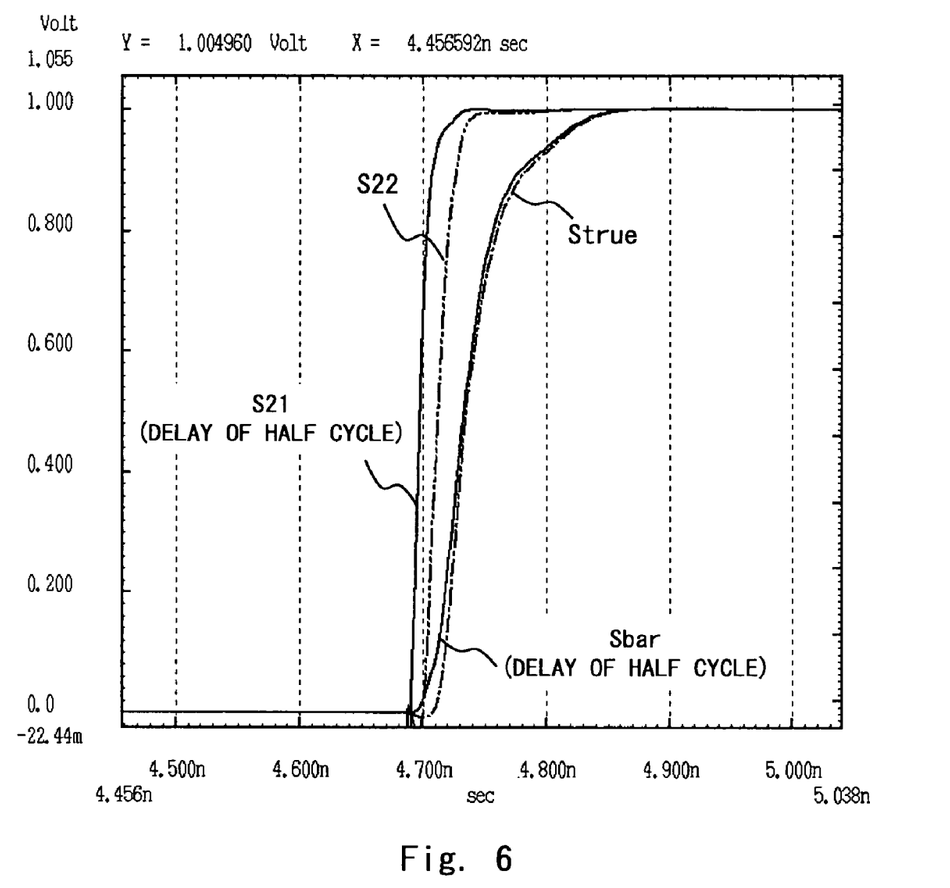
FIG. 6 is a waveform diagram of a simulation result of the complementary signal generating circuit of the second embodiment.

FIGS. 5 and 6 show simulation results of waveforms of the complementary signal generating circuit of this embodiment. FIG. 5 shows a waveform from the rising to the falling of the in-phase signals Strue and S22 and a waveform from the falling to the rising of the reverse phase signals Sbar and S21.

Denoted by 501 and 502 of FIG. 5 are cross-points between the reverse phase signal S21 and the in-phase signal S22. The cross-point 501 is at about 0.1 V, that is, a value approximate to 0.0 V as Low level. The cross-point 502 is at about 0.9 V, that is, a value approximate to 1.0 Vas High level. A cross-point between the in-phase signal Strue and the reverse phase signal Sbar is denoted by 503 of FIG. 5. The cross-point 503 is at about 0.65 V on both of the rising edge and the falling edge, that is, a value approximate to an intermediate level between High level and Low level.

FIG. 6 shows waveforms of the in-phase signals Strue and S22 on the rising and waveforms of the reverse phase signals Sbar and S21 on falling, which are delayed by a half cycle. As shown in FIG. 6, the level of the in-phase signal S22 rises with a delay from the reverse phase signal S21. Further, the levels of the in-phase signal Strue and reverse phase signal Sbar rise with a delay from the in-phase signal S22. The in-phase signal Strue and the reverse phase signal Sbar have substantially the same through rate, and there is almost no difference in delay therebetween.

As described above, in this embodiment, the transfer gate is provided in place of the depletion type MOS transistor of the first embodiment. Thus, similar to the first embodiment, a driving ability of the complementary signal can be improved.

Third Embodiment

Next, a signal generating circuit according to a third embodiment of the present invention is described. In the signal generating circuit of this embodiment, a level shifting circuit is connected with the complementary signal generating circuit of the second embodiment.

Figure 7:
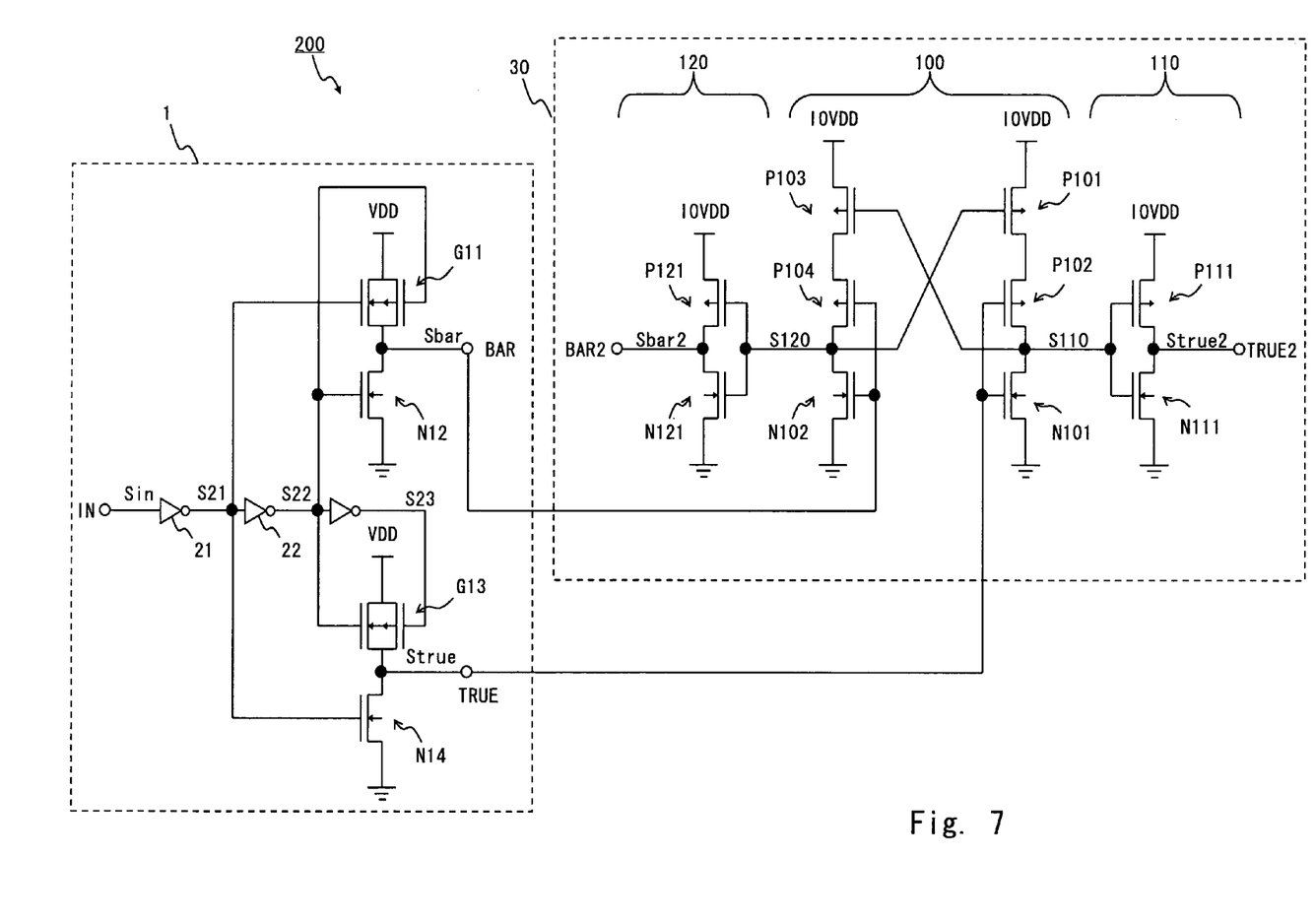
FIG. 7 is a circuit diagram of the configuration of a signal generating circuit according to a third embodiment of the present invention.

FIG. 7 is a circuit diagram of the configuration of the signal generating circuit of this embodiment. In this signal generating circuit, the complementary signal generating circuit 1 of FIG. 4 is connected with a level shifting circuit 30 of FIG. 11. The in-phase signal Strue of the complementary signal generating circuit 1 is supplied to gates of the P-channel MOS transistor P102 and the N-channel MOS transistor N101. The reverse phase signal Sbar of the complementary signal generating circuit 1 is supplied to gates of the P-channel MOS transistor P104 and the N-channel MOS transistor N102. Each circuit configuration is the same as those of FIGS. 4 and 11.

In a conventional complementary signal generating circuit 920 of FIG. 11, a difference in delay occurs between the in-phase signal Strue and the reverse phase signal Sbar. So, at a subsequent stage, this difference in delay is minimized by the level shifting circuit 30. In this embodiment, as described above, in the complementary signal generating circuit 1, a difference in delay between the in-phase signal Strue and the reverse phase signal Sbar is reduced, thereby making it unnecessary to adjust a difference in delay using the level shifting circuit 30 at a subsequent stage. Therefore, the level shifting circuit 30 is prevented from operating unnecessarily, and a signal can be output efficiently.

Figure 8:
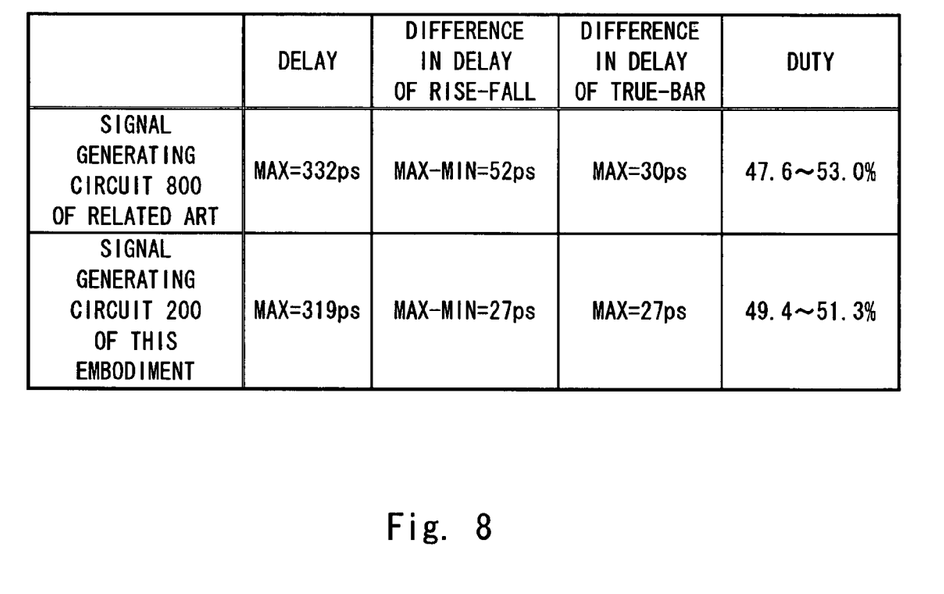
FIG. 8 shows a simulation result of a signal generating circuit of the third embodiment.

FIG. 8 shows simulation results in the conventional signal generating circuit 800 of FIG. 11 and the signal generating circuit 200 of this embodiment in FIG. 7. The above simulation results are obtained by evaluating the in-phase signal Strue2 and reverse phase signal Sbar2 output from the complementary signal generating circuit and the level shifting circuit.

As shown in FIG. 8, a delay of the in-phase signal Strue2 against the input signal and a delay of the reverse phase signal Sbar2 against the input signal Sin are 319 ps in the signal generating circuit 200; this value is smaller than that of the conventional signal generating circuit 800. This is because in the complementary signal generating circuit 1, a difference in delay between the in-phase signal Strue and the reverse phase signal Sbar is small, and an operational load of the level shifting circuit 30 is lightened.

As shown in FIG. 8, a difference in delay between the in-phase signal Strue2 and the reverse phase signal Sbar2 on the rising edge and the falling edge is 27 ps in the signal generating circuit 200; this value is smaller than that of the conventional signal generating circuit 800. This is supposedly because, in a flip-flop 100 of the level shifting circuit 30, an signal of opposite side is fed back to generate a signal output from the flip-flop 100, so a difference in delay is caused.

The difference in delay of the in-phase signal Strue2 and the reverse phase signal Sbar2 are substantially the same. A duty ratio of the in-phase signal Strue2 and reverse phase signal Sbar2 in the signal generating circuit 200 ranges from 49.4 to 51.3%; this range is narrower than that of the conventional signal generating circuit 800. That is, variations in duty ratio are small.

In this way, even if the level shifting circuit is provided downstream of the complementary signal generating circuit, a difference in delay or duty ratio can be reduced as compared with the conventional circuit.

Other Embodiment

Incidentally, in the above embodiments, the reverse phase signal S21 is generated by the inverter 21 and the in-phase signal S22 is generated by the inverter 22. However, the inverter 21 may be omitted or replaced by another logic gate. In this case, S21 is an in-phase signal, and S22 is a reverse phase signal. In addition, the terminal BAR for outputting the reverse phase signal Sbar and the terminal TRUE for outputting the in-phase signal Strue change their functions, but their operations are the same as above.

Further, the above embodiments describe the transistors N11 to N14 as N-channel type transistors, but P-channel type transistors may be used. The transistors N11 to N14 may be transistors other than the MOS transistors.

It is apparent that the present invention is not limited to the above embodiment that may be modified and changed without departing from the scope and spirit of the invention.

What is claimed is:

1. A complementary signal generating circuit, comprising:
   an inverting element inverting a first signal to generate a second signal;
   a first transistor connecting a first power supply potential and a first output terminal electrically in accordance with the first signal;
   a second transistor connecting the first output terminal and a second power supply potential electrically in accordance with the second signal;
   a third transistor connecting the first power supply potential and a second output terminal electrically in accordance with the second signal; and
   a fourth transistor connecting the second output terminal and the second power supply potential electrically in accordance with the first signal,
   wherein a delay of a rising waveform from the first output terminal against the first signal and a delay of a falling waveform from the second output terminal against the first signal are set substantially the same, and
   a delay of a falling waveform from the first output terminal against the second signal and a delay of a rising waveform from the second output terminal against the second signal are set substantially the same.

2. The complementary signal generating circuit according to claim 1, wherein the first to forth transistors have a same conductivity type.

3. The complementary signal generating circuit according to claim 2, wherein the first to fourth transistors comprise N-channel type MOS transistors.

4. The complementary signal generating circuit according to claim 1, wherein the first and third transistors comprise depletion type transistors.

5. The complementary signal generating circuit according to claim 1, further comprising:
   a fifth transistor connected in parallel with the first transistor and connecting the first power supply potential and the first output terminal electrically in accordance with the second signal; and
   a sixth transistor connected in parallel with the third transistor and connecting the first power supply potential and the second output terminal electrically in accordance with a third signal obtained by inverting the second signal.

6. The complementary signal generating circuit according to claim 5, wherein the first and fifth transistors constitute a first transfer gate, and
   the third and sixth transistors constitute a second transfer gate.

7. The complementary signal generating circuit according to claim 1, wherein the first and third transistors have substantially a same size, and the second and fourth transistors have substantially a same size.

8. The complementary signal generating circuit according to claim 1, wherein a first signal output from the first output terminal is in phase with the first signal, and a second signal output from the second output terminal is in reverse phase with the first signal.

9. A complementary signal generating circuit, comprising:
   a first transistor where a first terminal is connected with a first power supply potential, a second terminal is connected with a first output terminal, and a signal input to an inverting element is supplied to a control terminal of said first transistor;
   a second transistor where a first terminal is connected with the first output terminal, a second terminal is connected with a second power supply potential, and an inverted signal output from the inverting element is input to a control terminal of said second transistor;
   a third transistor where a first terminal is connected with the first power supply potential, a second output terminal is connected with a second terminal, and the inverted signal output from the inverting element is input to a control terminal of said third transistor; and
   a fourth transistor where a first terminal is connected with the second output terminal, a second terminal is connected with the second power supply potential, and the signal input to the inverting element is supplied to a control terminal of said fourth transistor,
   wherein a delay of a rising waveform from the first output terminal against the signal input and a delay of a falling waveform from the second output terminal against the signal input are set substantially the same, and
   a delay of a falling waveform from the first output terminal against the inverted signal and a delay of a rising waveform from the second output terminal against the inverted signal are set substantially the same.

10. The complementary signal generating circuit according to claim 9, wherein
    the first to fourth transistors comprise N-channel type MOS transistors, and
    the first terminal of each of said first to fourth transistors comprises a drain terminal and the second terminal of each of said first to fourth transistors comprises a source terminal.

11. The complementary signal generating circuit according to claim 9, further comprising:
    a fifth transistor where a first terminal is connected with the first power supply potential, a second terminal is connected with the first output terminal, and the signal output from the inverting element is input to a control terminal of said fifth transistor; and
    a sixth transistor where a first terminal is connected with the second power supply potential, a second terminal is connected with the second output terminal, and a signal obtained by inverting the inverted signal output from the inverting element is input to a control terminal of said sixth transistor.

12. The complementary signal generating circuit according to claim 9, wherein the first and third transistors comprise depletion type transistors.

13. The complementary signal generating circuit according to claim 9, wherein
    the first and third transistors have substantially a same size, and
    the second and fourth transistors have substantially a same size.

14. The complementary signal generating circuit according to claim 8, wherein a rising and a falling of said first output signal coincide without a delay with a falling and a rising, respectively, of said second output signal.

15. The complementary signal generating circuit according to claim 8, wherein a rising and a falling of said first output signal comprise different durations from each other.

16. A complementary signal generating circuit, comprising:
   a first input signal;
   a second input signal substantially inverted to said first input signal;
   a first transistor connecting a first power supply potential and a first output terminal electrically in accordance with the first input signal;
   a second transistor connecting the first output terminal and a second power supply potential electrically in accordance with the second input signal;
   a third transistor connecting the first power supply potential and a second output terminal electrically in accordance with the second input signal; and
   a fourth transistor connecting the second output terminal and the second power supply potential electrically in accordance with the first input signal,
   wherein a delay of a rising waveform from the first output terminal against the first signal and a delay of a falling waveform from the second output terminal against the first signal are set substantially the same, and
   a delay of a falling waveform from the first output terminal against the second signal and a delay of a rising waveform from the second output terminal against the second signal are set substantially the same.

17. The complementary signal generating circuit according to claim 16, wherein:
   said second input signal begins rising from a logic low level to a logic high level less than one half clock cycle after said first input signal begins falling from a logic high level to a logic low level, and
   said second input signal begins falling from a logic high level to a logic low level less than one half clock cycle after said first input signal begins rising from a logic low level to a logic high level.

* * * * *